US012696027B2

(12) United States Patent
Bonanno

(10) Patent No.: US 12,696,027 B2
(45) Date of Patent: *Jul. 28, 2026

(54) GAMING HEADSET WITH PROGRAMMABLE AUDIO PATHS

(71) Applicant: Voyetra Turtle Beach, Inc., White Plains, NY (US)

(72) Inventor: Carmine J. Bonanno, White Plains, NY (US)

(73) Assignee: Voyetra Turtle Beach, Inc., White Plains, NY (US)

( * ) Notice: Subject to any disclaimer, the term of this patent is extended or adjusted under 35 U.S.C. 154(b) by 255 days.

This patent is subject to a terminal disclaimer.

(21) Appl. No.: 18/369,371

(22) Filed: Sep. 18, 2023

(65) Prior Publication Data

US 2024/0007780 A1 Jan. 4, 2024

Related U.S. Application Data

(63) Continuation of application No. 17/503,641, filed on Oct. 18, 2021, now Pat. No. 11,778,364, which is a
(Continued)

(51) Int. Cl.
*H04R 1/10* (2026.01)
*A63F 13/24* (2014.01)
(Continued)

(52) U.S. Cl.
CPC ........... *H04R 1/1041* (2013.01); *A63F 13/24* (2014.09); *G06F 3/165* (2013.01); *G10L 15/00* (2013.01);
(Continued)

(58) Field of Classification Search
CPC ........ H04R 1/1008; H04R 3/04; H04R 5/033; H04R 2201/107; H04R 2201/109;
(Continued)

(56) References Cited

U.S. PATENT DOCUMENTS 7,627,128 B2 12/2009 Sander et al.
7,636,444 B2 12/2009 Cronin
(Continued)

FOREIGN PATENT DOCUMENTS

WO 2009/146700 A1 12/2009

OTHER PUBLICATIONS

Turtle Beach Ear Force X3 headphone, "First Wireless Headphone forXBOX360 with Independent vol. Control of Amplified Chat and Game Audio"2pp, retrieved from the Internet:http://www.turtlebeach. com/releases/2000708227/Turtle-Beach Announcement/.

*Primary Examiner* — Sunita Joshi
(74) *Attorney, Agent, or Firm* — McAndrews, Held & Malloy, Ltd.

(57) ABSTRACT
A headset having game, chat and microphone audio signals is provided with a programmable signal processor for individually modifying the audio signals and a memory configured to store a plurality of user-selectable signal-processing parameter settings that determine the manner in which the audio signals will be altered by the signal processor. The parameter settings collectively form a preset, and one or more user-operable controls can select and activate a preset from the plurality of presets stored in memory. The parameters stored in the selected preset can be loaded into the signal processor such that the sound characteristics of the audio paths are modified in accordance with the parameter settings in the selected preset.

18 Claims, 7 Drawing Sheets

Related U.S. Application Data continuation of application No. 15/155,408, filed on May 16, 2016, now abandoned, which is a continuation of application No. 14/514,601, filed on Oct. 15, 2014, now Pat. No. 9,380,373, and a continuation-in-part of application No. 13/949,754, filed on Jul. 24, 2013, now Pat. No. 10,695,668, said application No. 14/514,601 is a continuation of application No. 13/040,144, filed on Mar. 3, 2011, now Pat. No. 8,879,751, said application No. 13/949,754 is a continuation of application No. 12/542,198, filed on Aug. 17, 2009, now Pat. No. 8,498,426.

(60) Provisional application No. 61/365,441, filed on Jul. 19, 2010, provisional application No. 61/189,311, filed on Aug. 18, 2008.

(51) Int. Cl.

| | |
|---|---|
| *G06F 3/16* | (2006.01) |
| *G10L 15/00* | (2013.01) |
| *G10L 15/22* | (2006.01) |
| *H03G 3/34* | (2006.01) |
| *H03G 11/04* | (2006.01) |
| *H04R 3/04* | (2006.01) |
| *H04R 5/033* | (2006.01) |
| *H04S 1/00* | (2006.01) |
| *H04S 7/00* | (2006.01) |

(52) U.S. Cl.

CPC ............. *G10L 15/22* (2013.01); *H03G 3/341* (2013.01); *H03G 11/04* (2013.01); *H04R 1/1008* (2013.01); *H04R 3/04* (2013.01); *H04R 5/033* (2013.01); *H04S 1/005* (2013.01); *H04S 7/306* (2013.01); *H04S 7/307* (2013.01); *H04R 2201/107* (2013.01); *H04R 2201/109* (2013.01); *H04R 2420/07* (2013.01); *H04R 2499/10* (2013.01)

(58) Field of Classification Search

CPC . H04R 2420/07; H04R 2499/10; H04S 1/005; H04S 7/306; H04S 7/307

See application file for complete search history.

(56) References Cited

U.S. PATENT DOCUMENTS

| | | | |
|---|---|---|---|
| 2003/0216178 | A1* | 11/2003 | Danieli ................ A63F 13/215 |
| | | | 463/35 |
| 2005/0117761 | A1* | 6/2005 | Sato ......................... H04S 1/00 |
| | | | 381/310 |
| 2007/0242834 | A1 | 10/2007 | Coutinho et al. |
| 2008/0311986 | A1* | 12/2008 | Reiss ..................... A63F 13/87 |
| | | | 463/35 |
| 2010/0040240 | A1 | 2/2010 | Bonanno |

* cited by examiner

Parameter controls
located on ear cup

Sound processor
located within the
headset

Sound processor
located within a
wireless remote unit

Sound processor
located within a housing
on the headset cable

Sound processor
located within a
desktop unit connected
to the headset

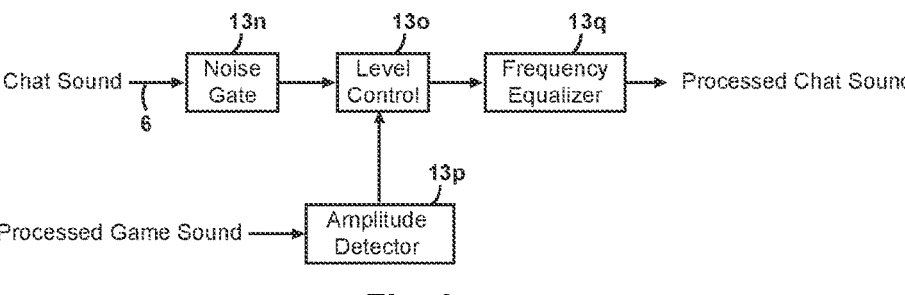

Chat Sound → [13n Noise Gate] → [13o Level Control] → [13q Frequency Equalizer] → Processed Chat Sound

6

Processed Game Sound → [13p Amplitude Detector] → (to Level Control)

Fig. 6

Processed Game Sound → [Volume Control] → (+)

Processed Chat Sound → [Volume Control] → (+)

Voice Prompt Sound → [Volume Control] → (+)

Microphone Sound to Headset → [Volume Control] → (+)

13r (+) → [13s Volume Limiter] → [13t Volume Control] → [Amp 7] → Speakers L / R

8

Speakers

Fig. 7

LEFT EAR CUP

RIGHT EAR CUP

GAMING HEADSET WITH PROGRAMMABLE AUDIO PATHS

CROSS REFERENCE TO RELATED APPLICATION

This application is a continuation of application Ser. No. 17/503,641, filed Oct. 18, 2021, which is a continuation of application Ser. No. 15/155,408, filed May 16, 2016, now abandoned, which is a continuation of application Ser. No. 14/514,601, filed Oct. 15, 2014 (U.S. Pat. No. 9,380,373), which is a continuation of application Ser. No. 13/040,144, filed Mar. 3, 2011 (U.S. Pat. No. 8,879,751), which claims priority to and the benefit of provisional application Ser. No. 61/365,441, filed Jul. 19, 2010. This application is also a continuation-in-part of application Ser. No. 13/949,754, filed Jul. 24, 2013, which is a continuation of application Ser. No. 12/542,198, filed Aug. 18, 2009 (U.S. Pat. No. 8,498,426), which claims priority to and the benefit of provisional application Ser. No. 61/189,311, filed Aug. 18, 2008. Each of the above referenced documents is incorporated by reference herein in its entirety.

FIELD OF THE INVENTION

The present invention relates to a headset assembly used in the field of video games played on personal computers or dedicated consoles. More particularly, the present invention relates to the enhancement of the game play experience by modifying the game, chat and microphone voice sounds comprising the audio signal paths in a gaming headset.

BACKGROUND OF THE INVENTION

Conventional gaming headsets may incorporate signal modifiers to improve the game, microphone and chat sounds. For example, a bass boost may be used to increase the sonic realism of explosions in the game sound. Or a signal booster may be incorporated into the chat signal to amplify the voice level of other players so they can be more easily heard when the game sound increases in volume. These sound modifiers in conventional gaming headsets are typically implemented with fixed signal modifiers and therefore suffer from several shortcomings, including the inability to easily modify the parameter settings of the sound modifiers or to easily recall such modifications.

A typical "gaming headset" used with personal computers or game consoles, such as the Microsoft Xbox or Sony PlayStation, combines the game sound with the voices from other players and includes a boom microphone positioned near the player's mouth, allowing the user to chat with other players. This type of gaming headset lets players verbally interact with one another while listening to the game sound. Typically, three distinct audio paths are provided; one for the game sound, another for the chat sound, and another for the microphone sound. Each path requires different forms of signal processing to optimize their intelligibility. By changing parameters of these sound paths independently it is possible to enhance specific characteristics that are unique to each path, thereby achieving a better gaming experience.

For example, U.S. Pat. No. 7,283,635 describes a headset with built-in memory to store parameter settings related to headset performance characteristics that can be measured during headset production and stored in the memory. A host adapter communicates with the headset through a serial communications port. This invention is intended to provide a more flexible design of headsets which allows for easily testing and quickly adjusting the individual performance characteristics of the headset, both during the manufacturing process and later throughout the life of the headset. The current invention is not intended to improve the manufacturability of the headset and is instead intended to modify discrete signal paths for improved performance during game play.

U.S. Pat. Nos. 5,202,927 and 4,731,850 describe programmable hearing aid systems. U.S. Pat. No. 5,202,927 incorporates a signal-processing circuit whose parameters are controlled wirelessly with an external keypad device so the user may adjust the hearing aid frequency response characteristics so it is better tailored to the person's hearing response. U.S. Pat. No. 4,731,850 describes a hearing aid that is programmable so as to have optimum electro acoustic characteristics. Parameter values of a programmable filter and amplitude limiter are programmed into EEPROM to allow the hearing aid to adjust automatically for optimum performance for speech, room reverberation and background noise. While these inventions allow modifying the characteristics of the hearing aid, they are meant to provide a means of adjusting the frequency response of the hearing aid so it better suits the user's ear characteristics. The present invention does not limit itself to the adjustment of frequency response for the purpose of tailoring the response to the characteristics of the listener's ear, but instead modifies the three sound paths in a gaming headset to improve the audio performance of the headset during game play.

U.S. Pat. No. 7,903,833 describes a programmable head-worn listening device that processes audio from microphones located on the ear cups to enhance the ability of a user to hear ambient sounds in different environments. The invention includes a programmable signal processor system to modify the microphone sound, but does not address the application of the current invention that applies to the processing of sounds specific to the gaming application of headsets.

US patent application US2008/0181424 describes a voice override an amplitude control system for an audio entertainment system that suppresses the music signal so that it may be overridden by a voice signal. The invention intended to be utilized as part of a public address system used for both music and voice communications. While prior art systems provided a means to allow the music signal to be abruptly overridden by the voice signal, the voice override circuit in U.S. Pat. No. 4,881,123 provides for a gradual attenuation of the music to a predetermined level by the voice signal and then the music signal gradually returning to its normal level upon termination of the voice signal. Again, the present invention differs from this invention because the game sound is not altered but rather the chat volume is increased.

As an example, since the headset covers both ears, it is difficult for the user to hear his own voice when speaking into the microphone, thereby causing him to speak louder than normal. Consequently, as described in U.S. Pat. No. 7,110,940, a portion of the microphone signal may be routed back to the headset speakers so the user can hear his voice while speaking into the microphone. Although it is desirable to adjust the level of microphone sound that is fed back to the speakers in this manner, it is cumbersome to do so because there is little room on the headset for a physical volume control to set this level. Therefore, this monitoring feature is typically implemented with a fixed volume level that may be either too soft or too loud for a particular user. It is not possible to adjust the microphone monitor level with an external personal computer and save it in the headset's local memory for easy recall by the user, thereby allowing a variable monitoring level to be achieved without the need for extra controls on the headset.

As a second example, the game sound heard in the headset will often exhibit a wide dynamic range whereby a low volume level can immediately increase to a loud volume level, for instance, when an explosion or other dynamic event occurs in the game. The loudness dynamics may be sustained for long periods of time, for instance during heated battle in an action game. As a consequence of this wide dynamic range, if the chat communication signals are set for a comfortable volume level during normal game passages, they cannot be heard over the loud game sound during louder game passages. Consequently, the user has to manually adjust the volume level of the chat signals to compensate for changes in the game level. To compensate for this, US 2010/0040240 describes how the chat voice level may be automatically increased as the game level increases so that the chat volume always remains above the game volume. In this instance, it is desirable to adjust the degree to which the chat volume increases in tandem with the game volume. However there is little room on the headset for adding the required parameter controls, so this gain boost parameter is often fixed and is not adjustable by the user. It is again not possible to adjust the gain boost setting as well as other related settings, such as the attack and release times, with a personal computer and save it in the headset's local memory for easy recall by the user, thereby allowing a customized boost feature to be achieved without the need for additional controls on the headset.

As a third example, the game sound may be processed by signal modifiers to make it more dynamic or realistic during the game. Enhancements such as bass boost, stereo expansion, and the like, can make the game sound more dramatic than the unprocessed game sound emanating from the console or personal computer. For example, in some games it is desirable to equalize the frequency response of the game audio to accentuate certain sounds in the game. The parameters for the signal modifiers are typically numerous and therefore cannot be adjusted with physical controls on the headset. Consequently, these parameters are often fixed and cannot be modified, other than turning the fixed values on or off with a simple button. It is not possible to adjust a plurality of signal modifier parameters with an external personal computer and save it in the headset's local memory for easy recall by the user, thereby allowing a large number of customized features to be implemented in the headset and easily controlled by the user.

As a fourth example, the game sound may sometimes reach unexpected loud crescendos that can potentially damage the hearing of the listener. Turning down the volume to compensate for the louder sounds makes it more difficult to hear softer sounds, and is therefore rarely done by the user. It would be therefore desirable to automatically limit the maximum volume of the headset to protect the user's hearing.

From these examples, it is apparent that many game sound parameters can be modified to improve the game experience, yet most gaming headsets do not allow the modification of parameters to adjust the sound. Even in the few cases where several parameters may be adjusted with physical controls, such as potentiometers, switches, and the like, each time the headset is used with a different game, or by a different user, the user must individually adjust these multiple parameters to his or her personal requirements or preferences. This method of adjustment makes it difficult to set the parameters desired by each user and to exactly replicate specific settings desired by the user.

Gaming headsets are used in different environments that require various settings of the sound modifier parameters. It is therefore desirable to provide an automated means of setting these parameters to process the game, voice and chat signal paths in ways that can improve the gaming experience. There are many different methods in which these signals may be processed, many of which will be described in this document. Each method of signal modification requires setting multiple parameters to control the specific effect.

There are several problems with the modification of a plurality of parameters.

One problem is that it is cumbersome for the user to set and adjust multiple parameters if the controls are located on the headset because of the number of controls and the awkwardness of manipulating controls located on the ear cups or on the connecting cable. In current manifestations of these headphones, several buttons and controls are placed on the ear cups, each controlling a specific parameter such as game volume, bass boost, and the like. Because of the limited space on a headset, the number and location of physical controls is very limited and therefore only a few parameters can be adjusted by the user.

Another problem is that the user cannot see the controls placed on the ear cups while wearing the headset, making it difficult to know which parameter is being changed when manipulating the controls.

Another problem is that it is difficult to adjust a plurality of parameter settings without a visual interface that presents all of the controls in a logical manner so they may be adjusted and saved for easy recall. The vast number of parameters that may be adjusted makes it impractical to provide hardware controls for setting the parameters. It would therefore be desirable to use computer software to view and control the parameters in a convenient and logical manner on a computer screen.

Another problem is that fixed hardware implementations of sound modification circuitry makes it difficult for the user to modify and replace the effects used for modifying the audio paths with custom variations that are desirable to the user. Instead, the user must settle for only those effects provided by the factory as defaults.

Another problem of fixed hardware implementations of sound modification circuitry is that it cannot be easily upgraded to new configurations. The fixed nature of the design inherently limits the ability to change signal routing and processing paths for improvements or changes to the original design.

When using a headset for personal computer games, it is possible to implement the sound modification system in software running on the personal computer. A problem with this implementation is that sound modification portion of the headset does not reside within the headset itself, but rather in the personal computer software. It is desirable to have the sound modification hardware and parameter settings for modifying the sound paths reside within the headset and not require an external computer system for modifying, saving and retrieving the settings. In this way, the sound modifiers become part of the headset and the user may use the same sound modifiers regardless of whether he is using the headset on his personal computer, a game console or the computer of another player.

OBJECTS OF THE INVENTION

It is therefore an object of the present invention to provide an improved gaming headset with programmable audio paths.

Another object is the provision of such an improved gaming headset with programmable audio paths that overcomes the above-given disadvantages.

SUMMARY OF THE INVENTION

A headset having game, chat and microphone audio signals is provided with a programmable signal processor for individually modifying the audio signals and a memory configured to store a plurality of user-selectable signal-processing parameter settings that determine the manner in which the audio signals will be altered by the signal processor. The parameter settings collectively form a preset, and one or more user-operable controls can select and activate a preset from the plurality of presets stored in memory. The parameters stored in the selected preset can be loaded into the signal processor such that the sound characteristics of the audio paths are modified in accordance with the parameter settings in the selected preset.

This invention considerably improves the versatility and audio performance of a gaming headset by replacing the fixed signal modification with a programmable signal modification that allows customization of the sound paths to optimize and customize the audio performance for the game being played. The versatility provided by the invention makes it possible to achieve significantly improved audio performance from a gaming headset while making it easier for the user to control and access the enhanced features.

BRIEF DESCRIPTION OF THE DRAWING

The above and other objects, features, and advantages will become more readily apparent from the following description, reference being made to the accompanying drawing in which:

FIGS. 4, 5, 6, and 7 are schematic diagrams of systems according to the invention;

DETAILED DESCRIPTION

Figures 1A, 1B, 1C, 1D:
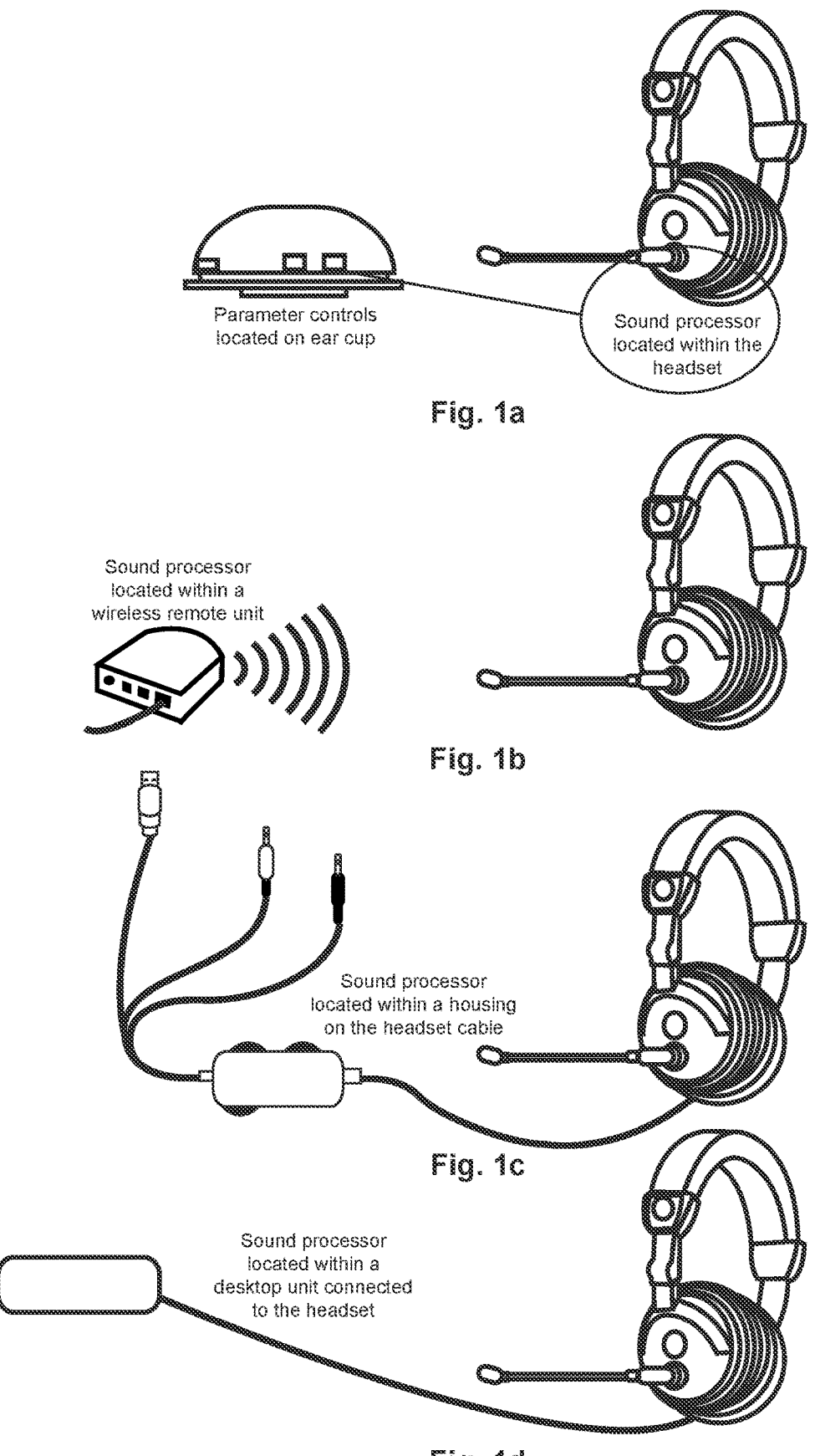
FIGS. 1a, 1b, 1c, and 1d show various setups of the gaming headset according to the invention.

As seen in FIG. 1a processor circuitry is located inside the ear cup with controls along the perimeter. FIG. 1b shows a wireless gaming headset with the processor circuitry located in the transmitting unit that sends a wireless signal to the headset. In this case, the sound modification would occur at the transmitter side rather than on the headset side, but the same effect would be achieved as if the sound modification occurred in the headset. The headset may have controls that, when activated, send a signal to the transmitter unit to control the processor circuitry inside the transmitter. FIG. 1c shows a wired headset with the processor circuitry located in a housing placed at some point along the wire connecting the headset to the source of game audio rather than in the headset itself. FIG. 1d shows how the processor circuitry may be incorporated into a headset accessory enclosed in a separate housing with connectors for attaching a headset to the housing, thereby achieving the same effect as if the invention were embodied as part of the headset itself.

In addition, although the description of the invention herein is based on the modification of game, chat and microphone sound paths, the invention also anticipates that a headset may also modify one or more of these sound paths in different combinations. For example, the invention may be applied to headphones for a home theater system that do not utilize a microphone or chat channel for online communication, so that only the sound of the home theater is modified within the headset. The sound modification functions may also be applied to either stereo or multi-channel sound paths from the home theater sound source to the headset speakers, so the invention is not limited to the application of stereo only signals.

In addition, the invention is equally effective on multi-speaker headphones as it is on stereo or multichannel (5.1) headphones. Therefore, although this the description of the invention herein is limited to its application in stereo gaming headset, multi-speaker gaming headsets that incorporate the modification of game, chat and microphone signals are also anticipated as obvious extensions of this invention.

Figure 2:
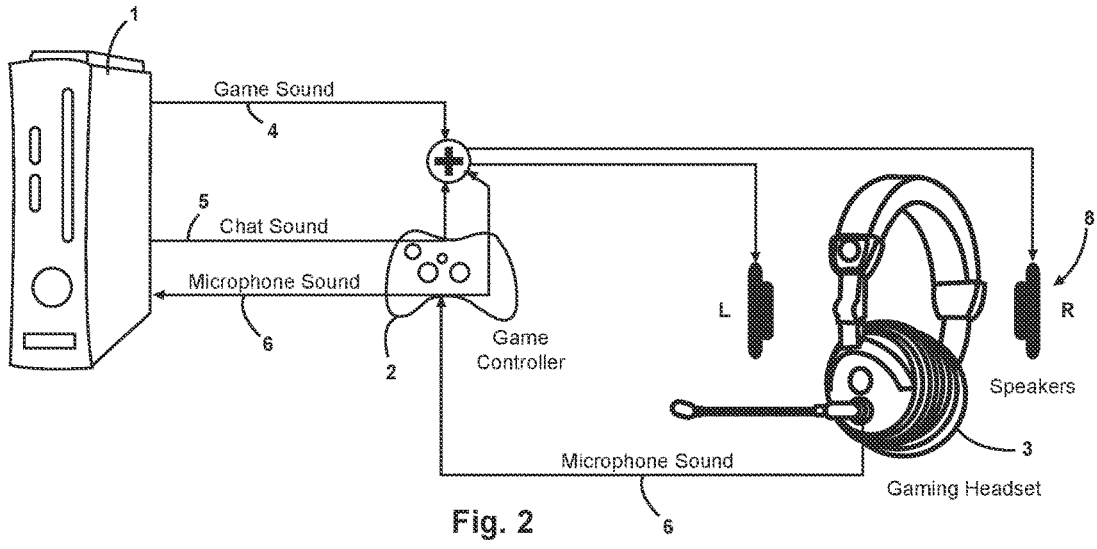
FIG. 2 is a schematic view of the instant invention.

FIG. 2 shows a typical gaming headset configuration with a game console in which the three main audio signals that flow between an XBOX game console 1 and a handheld game controller 2 to the gaming headset 3. These signal flow in audio paths 4, 5, and 6 for the game sound, the sound of voice chat from online players, and the sound from the microphone located on the headset 3. On a PlayStation console or personal computer, the chat and microphone signals are brought back to the console rather than routed to the handheld controller, but this does not change the principles described herein because the basic concept of three discrete audio streams is the same.

The game sound 4 and chat signals 5 are typically mixed together and amplified within the headset 3 and then routed to headset speakers 8. The microphone signal 6 is routed to the game console via the game controller 2 and a portion of the microphone signal is also mixed with the game and chat signals so the user can hear his own voice in the speakers 8.

Figure 3A:
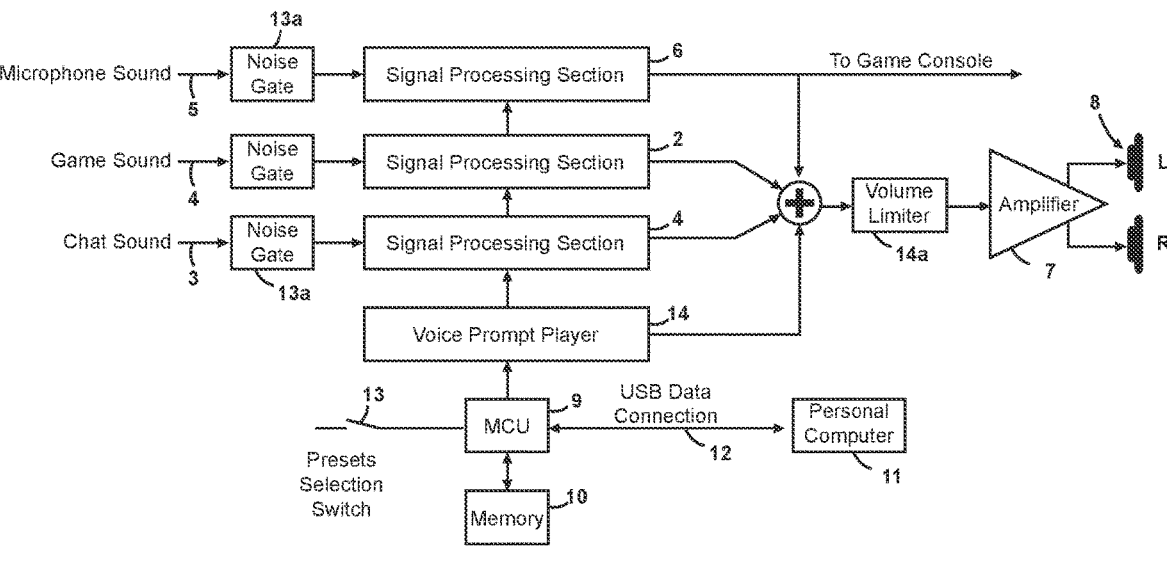
FIG. 3A is a schematic diagram illustrating a system according to the invention.

FIG. 3A shows how the invention modifies the three signal paths inside a typical gaming headset with individual signal-processing sections. The game signal 1 is processed by signal-processing section 2, the chat signal 3 is processed by signal-processing section 4 and the microphone signal 5 is processed by signal-processing section 6. These three signals are summed together, each with their own volume levels, and the summed signal is routed to an amplifier 7 that drives the headset speakers 8. The processed microphone signal is also routed to the game console. A Micro-Controller Unit (MCU) 9 is used to configure the settings in each signal-processing section per the values stored in read-write nonvolatile memory 10.

The parameter settings in each signal-processing section may be edited on software running on a personal computer 11 that is connected to the MCU 9 via a Universal Serial Bus (USB) or other type of data connection 12. With this configuration, the user may edit the settings in the signal-processing sections using the personal computer software and then transfer the data from the personal computer editing software to the memory unit 10 through the MCU 9 via the data link 12. Once the data is transferred, the data link 12 may be disconnected, allowing the headset 3 to be reconfigured according to the stored settings in the memory unit 10 by pressing control buttons 13. Thus, the invention allows the user to configure the three signal-processing paths in the headset 3 and optimize the game sound, and to store a plurality of different parameter settings in the memory unit such that the settings may be easily accessed by pressing controls on the headset 3, such as a button or control knob.

Figure 3B:
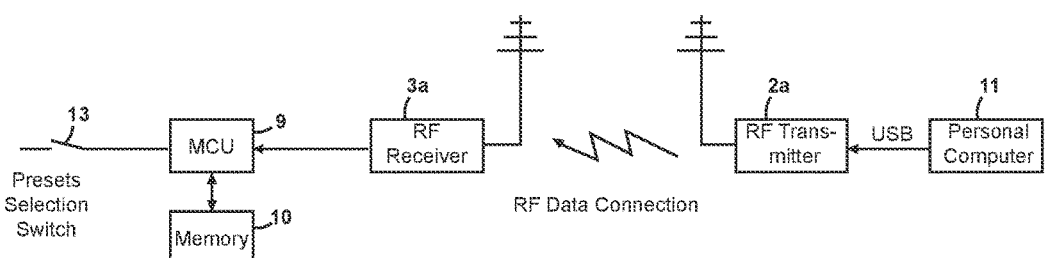
FIG. 3B is a diagram of a hookup for the system of this invention.

Alternately, the data may be transferred from the personal computer to the headset via an RF link, as shown in FIG. 3B. Here, the personal computer 1 is connected to an RF transmitter 2a that uses RF transmission to transfer the data to an RF receiver 3a in the headset. The data from this receiver 3a is sent to the MCU 4 that transfers it to local memory 5. This configuration is much like the configuration shown in FIG. 3A, which the exception that an RF link is placed between the personal computer and headset for data transfer.

Referring again to FIG. 3A, a voice prompt player 14 or digital playback device is provided that is capable of storing a plurality of digital recordings that may be triggered by control signals from the MCU 9 in response to user input or system activity. This may be used, for example, to notify the user that the headset battery is nearly drained, to announce which preset is active when pressing a button on the headset, and so on. Thus, it would not be necessary for the user to see which specific control has been activated in order for him to know the status of the control because the voice prompt will announce the status. For example, referring to FIG. 3A, the preset control button 13 can be configured such that, when it is pressed, the signal-processing sections 2, 4 and 6 are reconfigured according to the data stored in the memory unit 10 and at such time, the voice playback device 14 plays a digitally recorded signal announcing to the user which number preset has been selected.

The MCU may be connected to a personal computer 11 via the data interface 12, allowing the digital recordings to be transferred between the voice prompt player 14 and the personal computer 11. It is therefore yet another unique aspect of this invention to provide a means of modifying the voice recordings in the voice playback device by allowing the user to record different sounds on the personal computer 11 and transfer the recordings to the voice prompt player 14 via the data link 12. This may be used, for example, to replace the factory preset voice recordings in the voice prompt player with recordings created by the user or with recordings downloaded from an Internet web site or other remote source of data storage. As an example of a practical application of this feature, a software program running on the personal computer may be used to record new voice prompts and the prompts may be edited as desired by the user. These edited versions may then be transferred back to the playback device via the data connection 12 to the MCU 9 to replace or modify the original voice prompts with custom versions of his own voice, or the voice of others.

As a second example of a practical application of this feature, the voice prompts may be downloaded from a remote location, such as an Internet web site, which hosts different types of voice prompts. This would allow replacing the installed voice prompts with voice prompts recorded in a different language, or with celebrity voices, and so on. The user may download the voice prompts from the Internet web site into the personal computer, and then transfer the voice prompts into the voice prompt player in the headset via the data connection between the personal computer and MCU.

To improve the signal-to-noise level of the headset 3, each of the signal paths incorporates a noise gate 13a that mutes the input signal whenever it drops below a preset threshold level. For, example, one of the most common complaints of gaming headset users is that background noise from the room is picked up by the microphone and heard by other players on line. The noise gate on the mic signal path therefore provides a method of eliminating the background noise by muting the microphone signal path unless the voice signal exceeds a preset threshold.

In order to protect the listener's hearing, it is desirable to limit the maximum volume level of the headset 3. Thus, the main output path incorporates a volume limiter 14a with a variable threshold that can be set by the user to limit the output signal level not to exceed the predetermined amplitude.

As described in FIG. 3A, the invention incorporates a separate signal-processing chain for the game, chat and microphone signal paths. This signal processor is typically implemented with a Digital Signal Processor (DSP) that can be programmed to process the incoming signal paths as desired. The signal-processing elements in each path are selected to optimally modify key aspects of the signal path by adjusting parameters that determine the way in which the signal is altered. These parameters are programmable by the user and may be stored in non-volatile memory for easy recall.

The descriptions herein of the signal-processing sections are merely examples of typical implementations of the discrete processing stages and other variations are possible. The invention is intended to provide means of modifying the audio paths with signal-processing elements and the specific implementation described herein is not intended to limit the scope of the possible ways in which the signal-processing elements may be combined, sequenced or modified.

Figure 4:
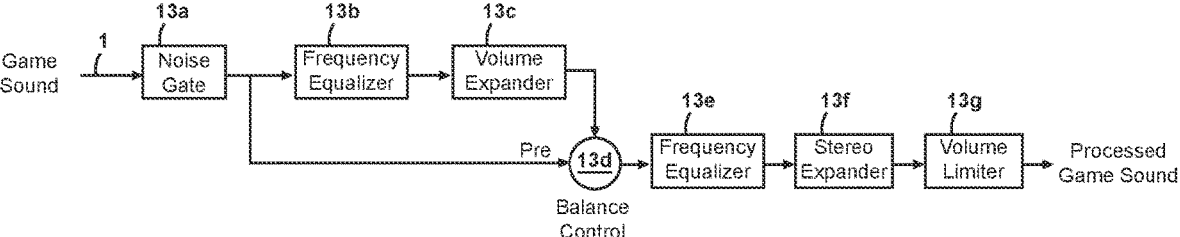

FIG. 4 illustrates the individual processing elements in the signal-processing section for the game audio path. This particular embodiment is shown here for the purpose of example and it is understood that modifications or additions to this path may be made by those familiar in the art of audio processing and that such modifications or additions do not affect the basic principle covered by this invention.

Referring to FIG. 4, the unprocessed game sound 1 is first processed by noise gate 13a that eliminates undesired noise from the game signal by muting the audio path whenever the game audio level drops below a preset threshold. The user may program this threshold setting to compensate for different noise levels in the game sound.

The second stage is comprised of two sections. The first is a frequency equalizer 13b that amplifies or attenuates specific frequencies of interest in the game sound so the frequency range may optimized for the desired sound range. The second is a volume expander 13c that boosts the amplitude of the game sound whenever the amplitude is below a threshold set by the user. Thus, only those sounds that lie within the preset frequency band and that are below the threshold will be increased in volume. This is useful, for example, to amplify sounds with specific frequency characteristics that are lower in volume than other sounds in the game, such as footsteps in the distance. A balance control 13d lets the user adjust the amount of processed and unprocessed sound.

This particular signal-processing element is a unique aspect of this invention that addresses a common problem when using a gaming headset, namely the inability to hear low sounds without also boosting the louder sounds. For example, in order to hear faint footsteps in the distance, one must turn up the master volume level of the entire headset to boost the game signal level. This inadvertently increases the volume of all sounds rather than just the soft sounds of interest, thereby making the sounds of explosions or gun shots too loud. To compensate for this inadvertent effect, this signal processing allows boosting only signals in a limited frequency range that are below a preset threshold while not affecting the volume of louder sounds that are above the threshold. Thus, for example, the user can adjust the parameters to boost the volume of certain sounds such as footsteps or the pulling of a pin on a grenade, and not boost other sounds outside of the selected frequency range.

The next stage 13e is a frequency equalizer similar to 13b that amplifies or attenuates specific frequencies of interest in the game sound. This may be used, for example, to boost bass. The next stage 13f is a stereo expander that widens the stereo sound field to make the game sounds on the left and right sides more accentuated than sounds in the center. The final stage is a volume limiter 13g that allows limiting the maximum amplitude of the game audio in order to protect the users hearing from being damaged by excessively loud sounds. The final processed game sound is then routed to a mixer, which is described in a later section of this document.

Figure 5:
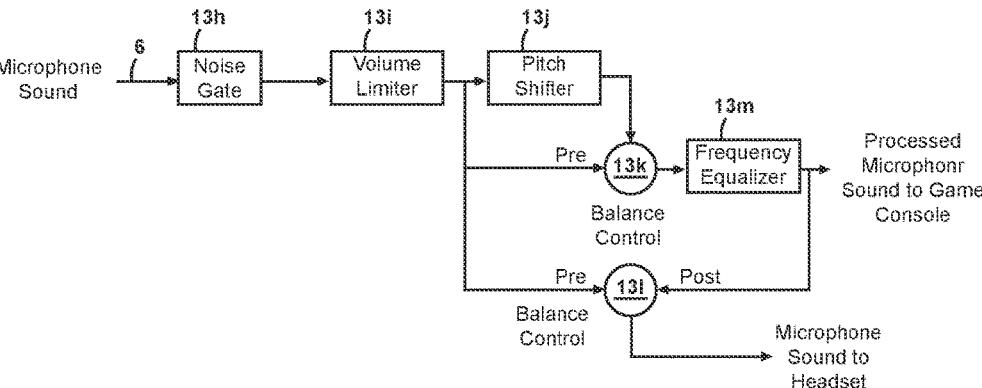

FIG. 5 illustrates the signal processor for the microphone audio path. In this particular embodiment, shown here for the purpose of example, the unprocessed microphone sound 6 is first processed by a noise gate 13h. This eliminates unwanted noise from the microphone signal by muting the audio path whenever the microphone input level drops below a preset threshold. For example, this may used to eliminate background noise in the room by setting the threshold just above the level of ambient noise and below the level of the microphone signal. Thus, whenever the user speaks into the microphone, the noise gate will pass the voice signal while blocking the background noise when there is no speech signal. The next stage 13i is a level control that limits the maximum microphone level so the signal will not overload if the user speaks too closely to the microphone. The next stage is a pitch shifter 13j that changes the pitch of the voice to make it sound higher or lower. This is useful if the user wants to be disguised when heard by other players. A balance control 13k sets the amount of pitch shifted voice and normal voice so that the two may be blended and combined in any proportion. A frequency equalizer 13m allows tailoring the voice frequency response. The processed microphone signal is routed to the game console. A balance control 13l routes the microphone signal to the headset amplifier so the user can hear the unprocessed or processed voice in the headset 3. A microphone monitor volume control on the output mixer stage, described later in this document, sets the level of the microphone signal heard in the headset.

FIG. 6 illustrates the signal-processing section for the chat audio path. In this particular embodiment, shown here for the purpose of example, the unprocessed chat sound 6 is first processed by a noise gate 13n that eliminates unwanted noise from the chat signal by muting the audio path whenever the level drops below a preset threshold. The user may program this threshold setting to compensate for different chat noise levels. This may be used, for example, to eliminate the digital background noise that typically emanates from the XBOX game controller's chat output. The next stage 13o is a level control whose gain is set by the output of Amplitude Detector 13p. The output control signal varies in response to the amplitude of the processed game sound such that it increases the gain of the level control 13o as the game volume increases, thereby increasing the chat volume in proportion to the game volume. The maximum level of gain for level control 13o is programmable by the user so that the amount of chat boost effect may be controlled for optimum effect. The next stage 13q is a frequency equalizer that allows tailoring the chat frequency response. The final processed chat sound is routed to a mixer in the output section, described below.

FIG. 7 illustrates the signal path for the output section, in which a mixer 13r combines the processed game, chat and microphone signals along with the voice prompt signal, each with its own volume control so they may be individually balanced. The mixed output is routed to a volume limiter 13s that limits the signal level sent to the headset amplifier, thereby protecting the user's hearing from excessively loud sounds in the mixed audio signal. At the end of the processing stage, a master volume control 13t sets the final signal level for the headset and the amplifier 7 drives headset speakers 8.

One key aspect of this invention is enabling the user to modify the sound characteristics of the particular signal path by controlling the parameters in each of the signal-processing stages within the path. Each processing stage includes a plurality of parameters, making it physically impossible to provide enough controls on the headset to adjust the parameters. Instead, the invention provides a means for viewing and editing these parameters with a software program running on a personal computer connected to the headset via a data interface, such as a USB serial connection. The software program displays all of the parameters that may be modified in the headset, including signal-processing parameters, volume settings, operational settings, and the like.

Figure 8:
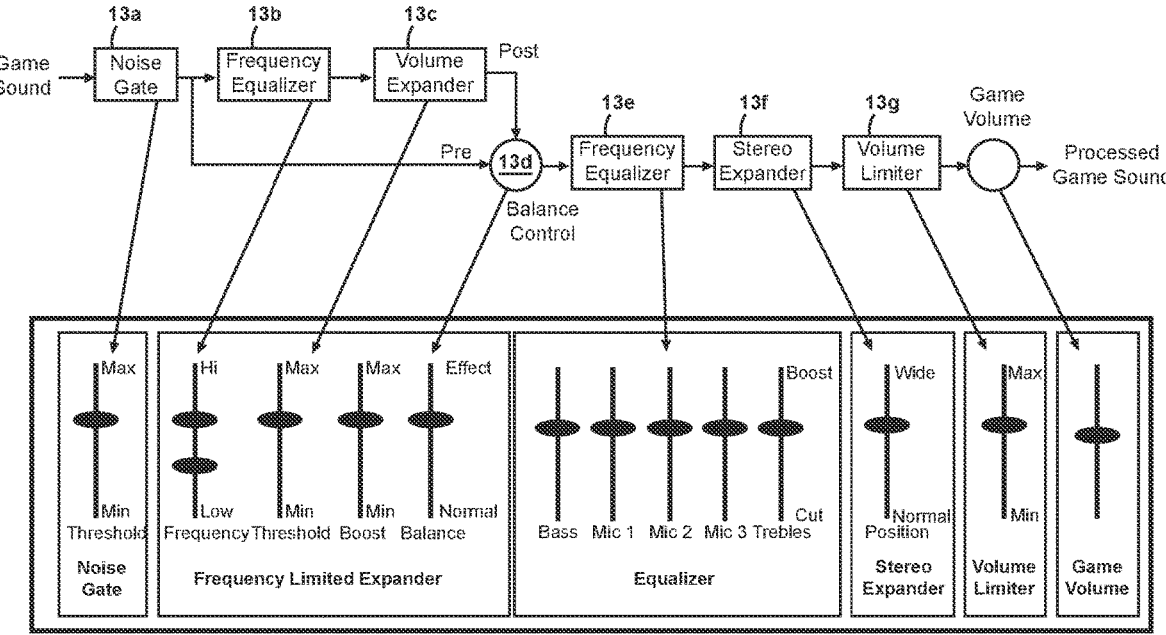
FIG. 8 is a view illustrating the relationship between the elements of the invention and a programming interface.

FIG. 8 illustrates a typical implementation of the software controls for the signal-processing stages in the game sound signal-processing path. The software presents a group of on-screen controls that may be manipulated with a computer mouse. Each control corresponds to a specific parameter in the signal-processing stages, as shown by the arrows in FIG. 8. These on-screen control settings allow the parameters to be viewed and edited in "real time" so the results of the changes can be heard while listening to how it affects the sound in the headset.

After editing these parameter settings using the software control panel, the settings may be saved as a "preset" to the personal computer hard drive for future retrieval, or transferred to the headset memory. When transferred to the headset memory, these presets may be accessed by pressing a button on the headset ear cup or external control device.

Figure 9:
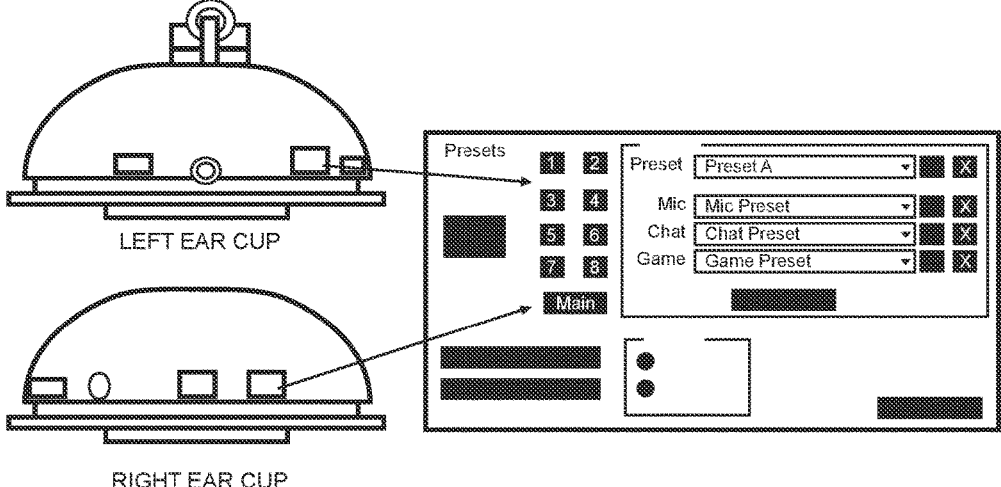
FIG. 9 is a diagram illustrating the relationship between headset controls and a programming interface.

FIG. 9 illustrates how the headset buttons correspond to the software preset settings stored in memory. In this example, eight software presets labeled 1-8 are shown next to a ninth alternative preset labeled Main. The actual number of presets is irrelevant and may be more or less than what is illustrated here.

Pressing the presets button on the left ear cup toggles through the eight presets stored in local memory. Pressing the Main button on the right ear cup toggles to a ninth preset. This allows the user to toggle between any one of eight presets and the main preset, simply by pressing the main button.

As noted earlier, a "master" preset is comprised of three sub-presets for the microphone, chat and game path. The combination of these three sub-presets making up a master preset is selected. These presets may be named, saved, recalled from memory and deleted using the illustrated controls.

Once the user is done editing the parameters in a preset, clicking any of the preset buttons or the main button will transfer the settings for the master preset from the personal computer memory to the headset memory for local control. Pressing PRESETS button 1 on the headset will step through the eight presets stored on the headset memory and the voice prompt will announce which one is active as they are toggled.

The preset saved in the Main preset location 4 is activated by pressing the Main on the right ear cup 3, allowing the user to easily switch between this Main preset and the selected preset from the group of eight, without having to toggle through all eight presets.

Figures 10A, 10B:
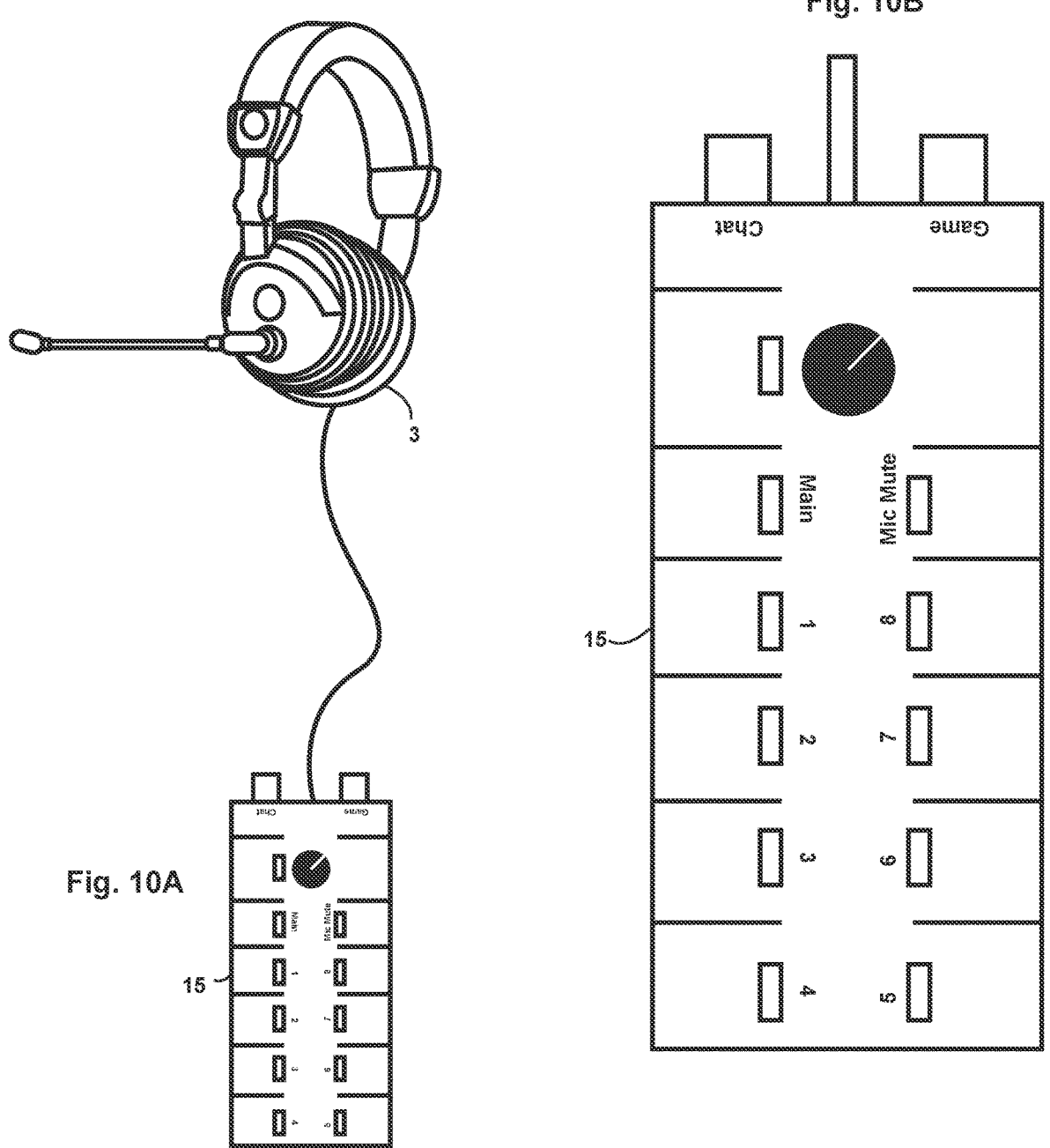
FIGS. 10A and 10B show a setup in accordance with the invention.

The presets may also be accessed by external controls, such as a wireless handheld or foot operated remote device, or, in the case of a wired headset, controls on the housing located on the wire connected to the headset. A specific example of this type of external control is illustrated in FIGS. 10A and 10B.

Here, an external control unit 15 is designed to strap on to the users arm or clip on to the belt. The unit 15 connects to the headset 3 via a data cable that carries bidirectional data signals between a microcontroller in the control unit 15 and the microcontroller in the headset 3. A set of eight buttons correspond to the eight presets stored in local memory. Pressing any one of these buttons will activate the selected preset and light the LED for the button. A main preset button toggles between the Main preset and the selected one of eight presets. Additional buttons and knobs can be added to make the headset easier to control, such as a mic mute button, game and chat volume controls. In addition, a knob and switch can be made programmable so that they can be assigned to control various parameters in the selected preset.

Figure 11:
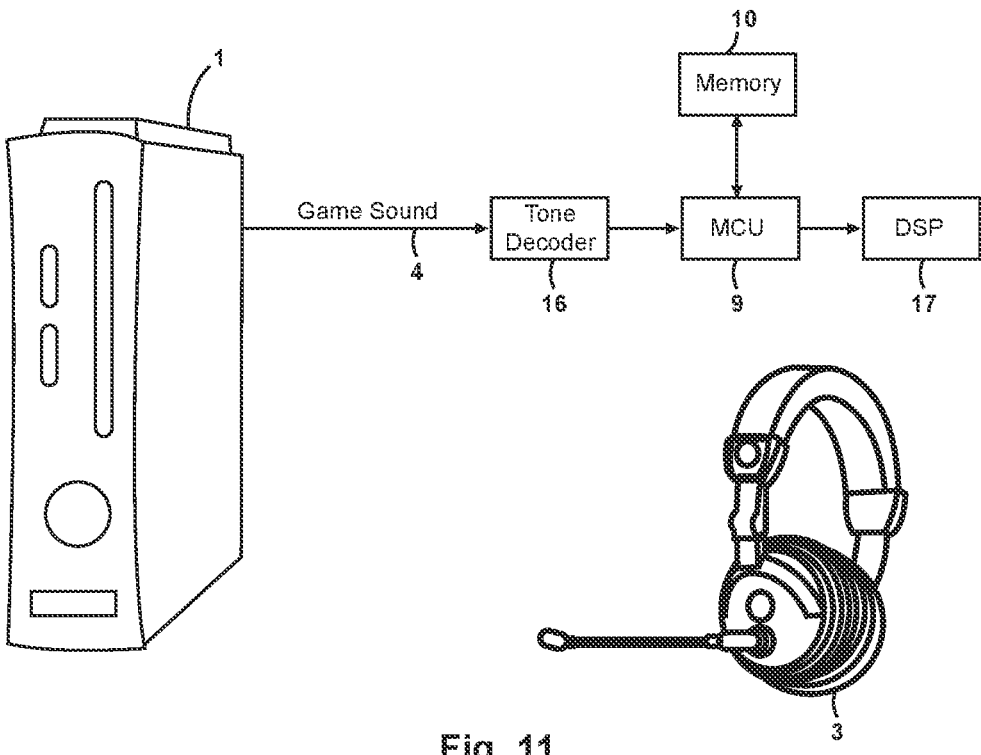
FIGS. 11 and 12 are schematic diagrams illustrating further aspects of the invention.

The presets may also be controlled via external tones embedded into the game so that the sound processing in the headset can change depending on the section of the game that is active, as illustrated in FIG. 11. Here, the XBOX 360 1 is used as an illustration, but it may be any game console, such as the PS3, Wii, Personal Computer and the like. In this embodiment, the game audio has specific tones embedded in the game sound 4 that are transmitted to a tone decoder 16. The tone decoder detects and converts the control tones into signals that are decoded by the MCU 9. If the MCU 9 detects a pattern corresponding to a preset number, it transfers the presets parameters corresponding to the selected preset from the memory 10 into the DSP 17 so that the sound modification characteristics attributed to the preset are active within the DSP 17. In this configuration, the game designer need only embed the distinct tones for representing the preset number, which can then be decoded by the headset 3 to automatically select the preset without any user intervention. Since the tones are very short, they are not likely to be heard during the game play and therefore can control the headset without distracting the user.

Figure 12:
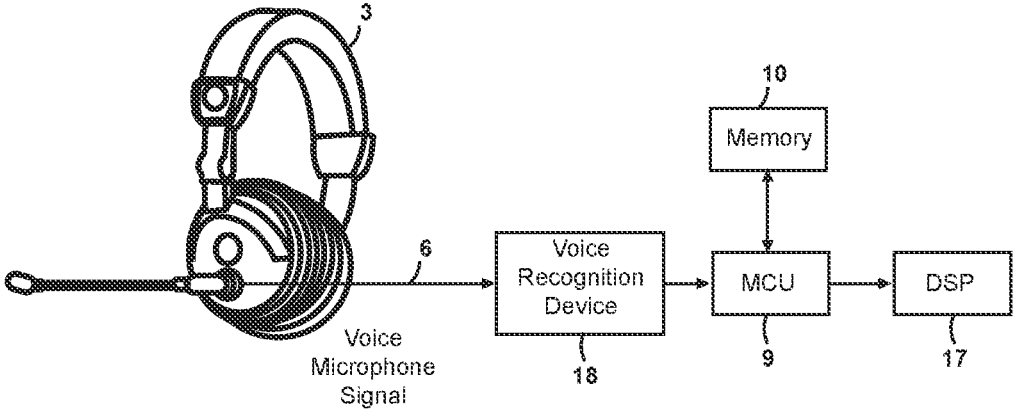

Yet another method of selecting presets is by using a voice recognition device, as illustrated in FIG. 12. Here, the voice sound 6 from the headset microphone is routed to a voice recognition circuit 18 whose output signal corresponds to a number that is spoken by user. This output signal is connected to MCU 9 that transfers the presets parameters corresponding to the selected preset from memory 10 into the DSP 17 so that the sound modification characteristics attributed to the preset are active within the DSP 17. In this configuration, the user need only speak the preset number he desires, which is then decoded by the headset unit to automatically select the preset without any user intervention.

What is claimed is:

1. A system comprising:
a signal processor operable to:
    detect one or more control tones that are embedded in a first audio signal, receive a voice command, and
    generate a second audio signal by modifying the first audio signal in accordance with the voice command and the one or more control tones.

2. The system of claim 1, wherein the system comprises:
a data port connection operable to receive one or more settings that control the modification of the first audio signal.

3. The system of claim 1, wherein the system comprises a headset, and wherein the signal processor is located in the headset.

4. The system of claim 1, wherein the system comprises a control device, and wherein the modification of the first audio signal is enabled via the control device.

5. The system of claim 4, wherein the control device is operable to wirelessly communicate with the signal processor.

6. The system of claim 1, wherein the one or more control tones are selected prior to being embedded in the first audio signal.

7. The system of claim 1, wherein the one or more control tones are programmed via a computer.

8. The system of claim 1, wherein the signal processor is reprogrammable.

9. The system of claim 1, wherein the signal processor comprises a plurality of signal paths, wherein each signal path in the plurality of signal paths includes a noise gate to remove undesired sounds below a preset threshold.

10. The system of claim 1, wherein the system comprises one or more speakers and a volume limiter, and wherein the volume limiter is operable to limit a maximum volume level sent to the one or more speakers such that it does not exceed a predetermined amplitude.

11. The system of claim 1, wherein the system comprises a sound storage device that announces a prerecorded message in accordance with the one or more control tones.

12. A headset comprising:
a signal processor operable to:
    detect one or more control tones that are embedded in a first audio signal,
    receive a voice command, and
    generate a second audio signal by modifying the first audio signal in accordance with the voice command and the one or more control tones.

13. The headset of claim 12, wherein the headset comprises a control device, and wherein the modification of the first audio signal is enabled via the control device.

14. The headset of claim 13, wherein the control device is operable to wirelessly communicate with the signal processor.

15. The headset of claim 12, wherein the signal processor is reprogrammable.

16. The headset of claim 12, wherein the signal processor comprises a plurality of signal paths, wherein each signal path in the plurality of signal paths includes a noise gate to remove undesired sounds below a preset threshold.

17. The headset of claim 12, wherein the headset comprises one or more speakers and a volume limiter, and wherein the volume limiter is operable to limit a maximum volume level sent to the one or more speakers such that it does not exceed a predetermined amplitude.

18. The headset of claim 12, wherein the headset comprises a sound storage device that announces a prerecorded message in accordance with the one or more control tones.

\* \* \* \* \*